United States Patent [19]

Ozias

[11] Patent Number: 5,244,694
[45] Date of Patent: * Sep. 14, 1993

[54] APPARATUS FOR IMPROVING THE REACTANT GAS FLOW IN A REACTION CHAMBER

[75] Inventor: Albert E. Ozias, Aumsville, Oreg.

[73] Assignee: Advanced Semiconductor Materials America, Inc., Phoenix, Ariz.

[*] Notice: The portion of the term of this patent subsequent to Sep. 13, 2008 has been disclaimed.

[21] Appl. No.: 695,410

[22] Filed: May 3, 1991

Related U.S. Application Data

[62] Division of Ser. No. 329,778, Mar. 29, 1987, Pat. No. 5,096,534, which is a division of Ser. No. 65,945, Jun. 4, 1987, Pat. No. 4,846,102.

[51] Int. Cl.$^5$ ............................................. C23C 16/00
[52] U.S. Cl. .............................. 427/248.1; 427/255.5; 118/715; 118/725; 118/730
[58] Field of Search ............... 118/715, 719, 725, 729, 118/730; 427/248.1, 255.5

[56] References Cited

U.S. PATENT DOCUMENTS 4,714,594 12/1987 Mircea ................................. 118/725

Primary Examiner—Richard Bueker

[57] ABSTRACT

Apparatus for carrying out an epitaxial deposition process upon a single wafer disposed in a reaction chamber. The chamber has a substantially rectangular cross section reduced in area for increased system efficiency. A susceptor may be mounted in a well or in a downstream portion of a dual height chamber having a greater cross sectional area. Purge gas supplied through an aperture in the chamber prevents undesirable reactant gas deposits beneath the susceptor. The velocity profile and flow of reactant gas beneath the susceptor are controlled by a shaped transversely extending gap between the susceptor and the upstream portion of the chamber.

4 Claims, 4 Drawing Sheets

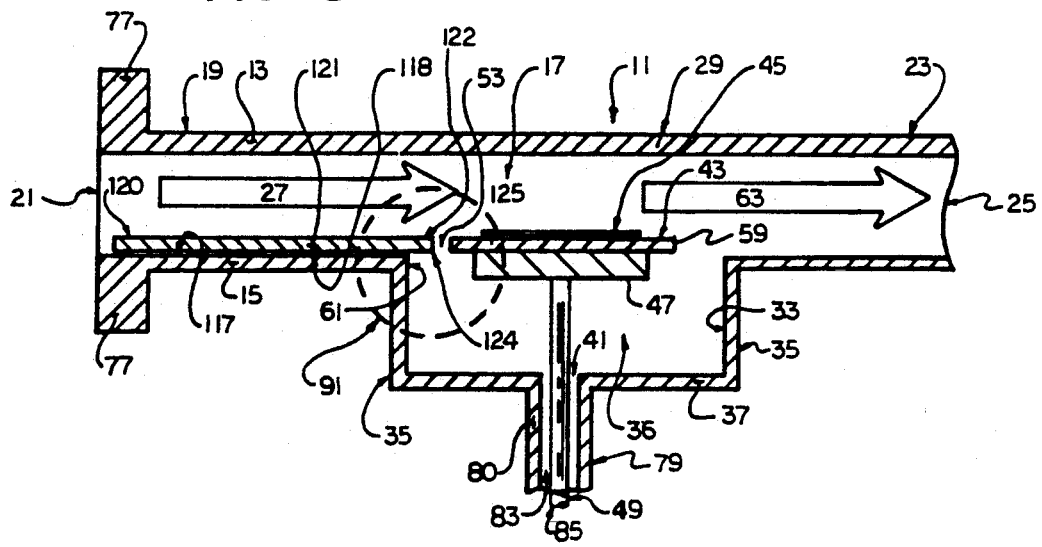
FIG. 5
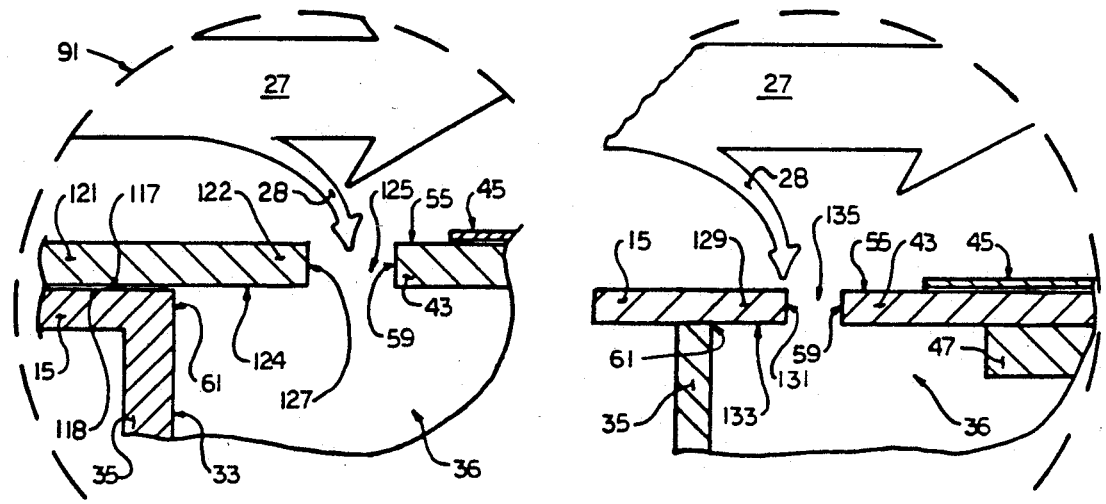
FIG. 6
FIG. 7
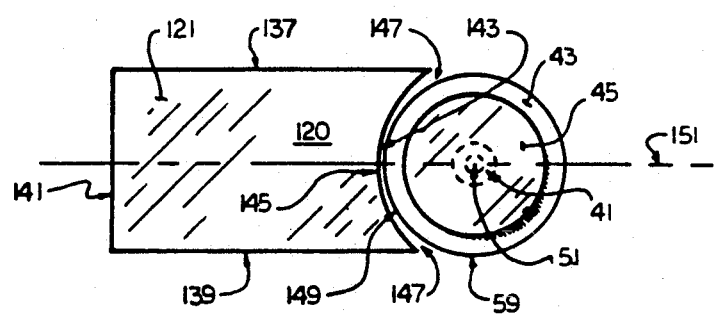
FIG. 8

5,244,694

APPARATUS FOR IMPROVING THE REACTANT GAS FLOW IN A REACTION CHAMBER

CROSS REFERENCE TO RELATED APPLICATION

The present application is a divisional of pending application Ser. No. 329,778 filed Mar. 29, 1987 entitled "Method for Improving the Reactant Gas Flow in a Reaction Chamber", now U.S. Pat. No. 5,096,534, which is a division of pending application Ser. No. 065,945, filed Jun. 4, 1987 entitled "Improved Gas Injectors for Reaction Chambers in CVD Systems", now U.S. Pat. No. 4,846,102. This application is also related to patent application Ser. No. 468,630, filed Jan. 23, 1990, now U.S. Pat. No. 5,044,315 which is a divisional application of application Ser. No. 065,945, filed Jun. 24, 1987, now U.S. Pat. No. 4,846,102.

BACKGROUND OF THE INVENTION

1. Field of the Invention

The present invention relates to improved reaction chambers used in Chemical Vapor Deposition (CVD) systems and, more particularly, to a method for controlling reactant gas flow in reaction chambers for use in epitaxial deposition systems for processing wafers on a one at a time basis.

2. Description of the Prior Art

Chemical Vapor Deposition (CVD) is the formation of a stable compound on a heated substrate or wafer by the thermal reaction or decomposition of certain gaseous compounds. Epitaxial growth is a specific type of CVD which requires that the crystal structure of the wafer be continued through the deposited layer.

The basic components of any CVD system include a reaction chamber which houses the wafer(s) to be processed, a gas control section, a timing and sequence control section, a heat source and an effluent handling component. The reaction chamber provides a controlled environment for the safe deposition of stable compounds. The chamber boundary may be quartz, stainless steel, aluminum or even a blanket of a non-reacting gas (such as nitrogen). Commercial epitaxial deposition reaction chambers may be one of three types, depending primarily upon the gas flow. In horizontal systems, the gas flows horizontally in one end of the reaction chamber, across the wafers, and out the other end. In vertical systems, the gas flows vertically toward the wafers from the top and the susceptor is normally rotated to provide more uniform temperature and gas distributions. In a cylindrical or barrel reactor system, the gas flows vertically into the chamber from the top and passes over the wafers on a rotating susceptor.

Heating in a cold wall CVD system is accomplished by radio frequency (RF) energy, radiation energy in the ultraviolet (UV) or infrared (IR) bands or resistance heating. In an RF heated susceptor, the energy in an RF coil is coupled into a silicon carbide coated carbon susceptor and the wafers are heated by conduction. Radiant UV or IR heating is accomplished by the use of high intensity lamps to heat the wafers and their holders. The chamber walls must be cooled to prevent a large temperature rise of the reaction chamber. In an epitaxial deposition system a carefully controlled environment is needed for the epitaxial deposition to take place.

The various gases used in an epitaxial reaction chamber include a nonreactive purge gas used at the start and end of each deposition if the reaction chamber is opened to the atmosphere after every run. The nonreactive purge gas, usually nitrogen, flushes unwanted gases from the reaction chamber. A carrier gas is used before, during and after the actual growth cycle. It is mixed with the gases responsible for etching, growth, or doping the wafer. Hydrogen is most often used as a carrier gas, although helium is sometimes employed. Etching gases may be used prior to the actual epitaxial deposition to remove a thin layer of silicon from the surface of the wafer together with any foreign matter or crystal damage that may be present. The etching prepares atomic sites for nucleating or initiating the epitaxial deposition process. The source gases for epitaxial depositions include Silane ($SiH_4$), Dichlorosilane ($SiH_2Cl_2$), Trichlorosilane ($SiHCl_3$) and Silicon tetrachloride ($SiCl_4$). The dopant gases normally used in epitaxial deposition include Arsine ($AsH_3$), Phosphine ($PH_3$), and Diborane ($B_2H_6$). The etching gas is commonly HCl.

The problems inherent in all prior art systems of CVD, particularly in the epitaxial deposition, include: non-uniform deposition on the surface of the wafer to be processed, the presence of contaminants in the reaction chamber prior to processing, wall deposits formed on the interior walls of the reactor chamber; deposition of the reactant chemicals on the heated susceptor and its support structure, inefficient gas flow characteristics, slow processing times and non-uniform depositions due to uncontrolled gas velocity profiles or gas density profiles.

These problems become even more important with the modern trend away from batch processing systems toward single wafer or one substrate at a time processes. In a single wafer processing system, the same volume of gas normally flowing through a reaction chamber with many wafers to be processed cannot be used since too much reactant gas will be consumed for one wafer. The cycle times to process a batch are far too long for single wafer processing. A single wafer process requires a more rapid deposition rate to minimize the cycle time. In single wafer processing, the deposits from reaction by-products build up far more rapidly on a per wafer basis than in batch processing. Customers are increasingly demanding reduced particulate contamination.

SUMMARY OF THE INVENTION

A reaction chamber has a top plate, a bottom plate parallel to the top plate, sides joining the top and bottom plate to define a hollow interior with a generally rectangular cross section, a reactant gas inlet at one end of the reaction chamber and a gas outlet at the opposite end of the reaction chamber for exhausting the gases therefrom. A well defining a cavity depends from the bottom plate to house a susceptor support for positioning a susceptor either slightly above, at or slightly below the plane of the bottom plate. The use of the well for positioning the susceptor enables the distance between the top and bottom plates to be reduced to approximately one-half of the normal distance to provide a reduced cross sectional area. The reduced cross sectional area enables the velocity of the reactant gases, which are supplied at a uniform flow rate, to be greatly increased to greatly reduce the processing time required for an epitaxial deposition operation. In an alternate embodiment of the reaction chamber, an expanded chamber is provided downstream from the susceptor to house the susceptor and means for supporting the susceptor and to provide ready access to the susceptor and its support structure.

A quartz bib or plate having an inwardly curved edge may be used to partially encircle a portion of the circumference of the susceptor to provide a narrow gap therebetween. The inwardly curved edge can be shaped or sized to significantly narrow the gap at the center along the longitudinal axis of the reaction chamber and to widen the gap in both directions toward the sides of the chamber for shaping the velocity profile of the gases to a predetermined profile to optimize the uniformity of the deposition on the wafer.

A primary object of the present invention is to provide an improved reaction chamber in single wafer chemical vapor deposition processing.

Another object of the present invention is to provide apparatus for controlling the reactant gas velocity profile to insure uniform deposition upon a wafer.

Still another object of this invention is to provide a single wafer CVD reaction chamber with fast processing time and without wasting reactant gases.

Yet another object of the present invention is to provide a single wafer CVD reaction chamber which reduces deposits beneath the susceptor.

A further object of the present invention is to provide apparatus for reducing carrier gas flow consumed on a per wafer basis.

These and other objects of the present invention will become apparent to those skilled in the art as the description thereof proceeds.

BRIEF DESCRIPTION OF THE DRAWINGS

The present invention will be described with greater specificity and clarity with reference to the following figures, in which:

FIG. 5 is a partial cross sectional view showing a quartz plate disposed on the bottom plate of the reaction chamber shown in FIG. 1;

FIG. 6 is an expanded view of one circled portion shown in FIG. 5;

FIG. 7 is an expanded view of another circled portion shown in FIG. 5;

FIG. 8 is a top view of the susceptor, wafer and quartz plate shown in FIG. 5;

DETAILED DESCRIPTION OF THE PREFERRED EMBODIMENT

Figure 1:
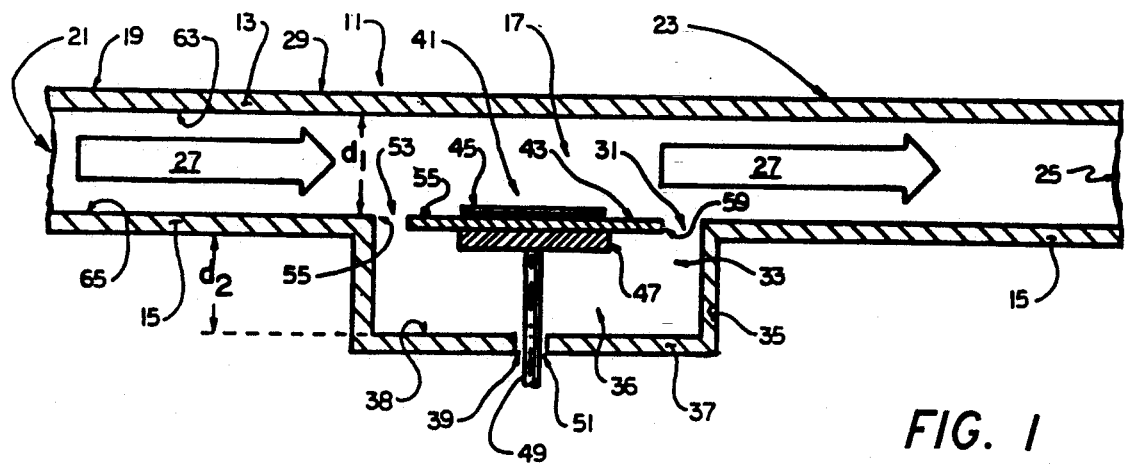
FIG. 1 is a partial cross sectional view of an epitaxial deposition reaction chamber.

FIG. 1 illustrates a cross sectional view of an epitaxial deposition reaction chamber referred to herein as a reduced area, deep well reaction chamber 11. The reaction chamber includes a top panel 13 and a bottom panel 15, each of which is an elongated, generally rectangular, substantially planar quartz panel substantially transparent to visible and shorter wavelength radiation to form, in part, a cold wall reactor. Reaction chamber 11 includes a front end 19 having a reactant gas inlet 21 and a rear end 23 having a spent gas outlet 25. The gas flow is indicated by arrow 27. A circular aperture 31 is disposed in the lateral center of bottom panel 15. A cylindrical well 33, including a cylindrical wall 35 and a bottom 37 having a central aperture 39 formed therein, depends from aperture 31 and defines cavity 36. Positioned above the center of aperture 39, within the top portion of cavity 36 and at least partially within aperture 31 is a susceptor assembly 41. The susceptor assembly includes a susceptor 43 having a planar top surface 51 for demountably positioning a wafer 45, a pedestal 47 and a shaft 49 depending from the pedestal through aperture 39 to drive means (not shown). A gasket or seal may be positioned within aperture 39 about shaft 49 for sealing purposes; conventional bearings may also be used. An annular gap 53 is formed between circumference 59 of the susceptor and lip 55 defining aperture 31.

The reactant gases flow through intermediate section 29 of reaction chamber 11 and a major portion of the gas flow passes over the top surface of wafer 45 and some portion (not shown) flows downwardly through gap 53 and into and out of cavity 36. Any reactant gas within cavity 36 can form undesirable chemical coatings or deposits on the heated undersurface of susceptor assembly 41 and well 33; these deposits may cause contamination problems, loss of time for cleaning, reduction in efficiency of the system, etc.

The vertical distance or height "$d_1$" measured between interior surface 63 of top panel 13 and interior surface 65 of bottom panel 15 is approximately one half of the distance used in prior art deposition systems. Reducing the height of at least the inlet portion of reaction chamber 11 reduces the cross sectional area through which the gas flows. The reduction in height would normally prevent the reaction chamber from being able to house the susceptor assembly 41. Well 33 provides the additional space required for housing the susceptor assembly within cavity 36 and for locating wafer 45 essentially coplanar with bottom panel 17 or slightly vertically disposed above the panel in order to obtain an optimal deposition on the wafer. The depth may be equal to or slightly greater than height "$d_1$". The purpose of reduced inlet 21 is to reduce the gas flow required for a given deposit by a factor of approximately one half or more. Assuming the depth of well 33 is slightly greater than $d_1$, even greater efficiencies can be realized.

Figure 2:
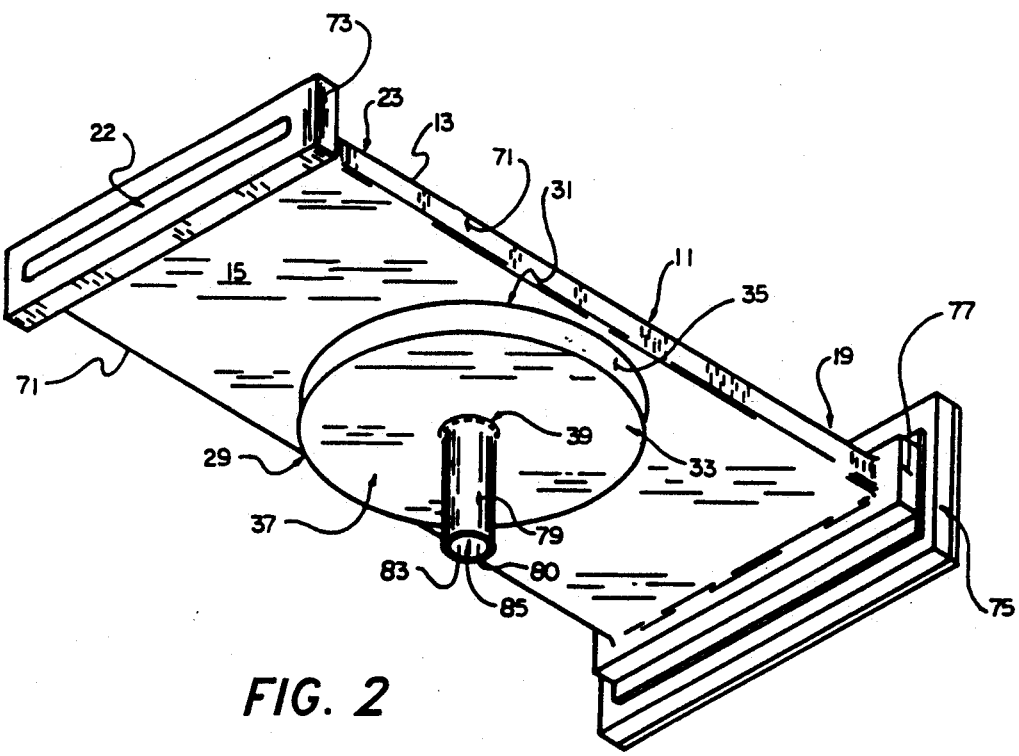
FIG. 2 is a perspective view of the reaction chamber shown in FIG. 1.

A pair of sides 71 are shown in FIG. 2 as interconnecting the edges of top and bottom panels 13, 15 to form an elongated, box like construction having a rectangular cross section and a generally hollow interior. Front end 19 of reaction chamber 11 includes a flange 77 positioned adjacent a combination gate and reactant gas injector port 75. Rear end 23 includes a flange 73 surrounding outlet 25 for exhausting the spent gases from within the reaction chamber. An elongated tube 79, having cylindrical wall 80, interior 84 and a purge gas inlet 86, depends from aperture 39 in bottom 37.

Figure 3:
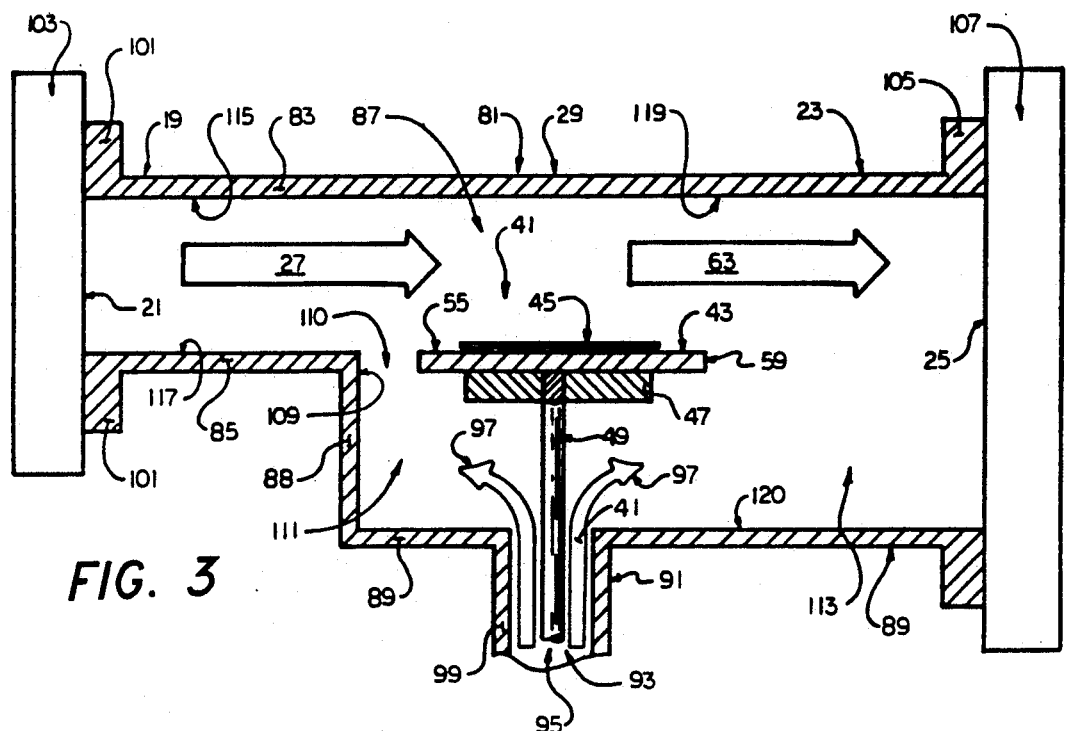
FIG. 3 illustrates a cross sectional view of an alternate embodiment of an epitaxial deposition reaction chamber.
Figure 4:
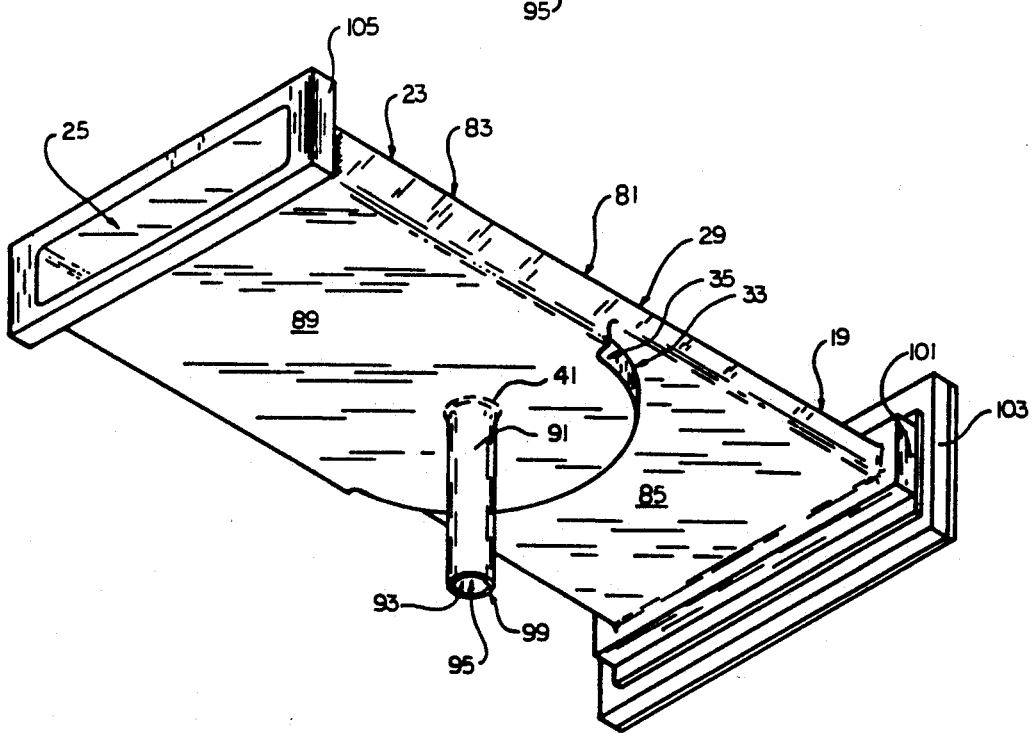
FIG. 4 is a perspective view of the reaction chamber shown in FIG. 3.

FIG. 3 illustrates a second embodiment of the epitaxial deposition reaction chamber 81 described herein. The reaction chamber is generally referred to as a dual height reaction chamber. It includes an elongated, generally rectangular, substantially planar, top panel 83 of quartz; the panel is transparent to higher frequency radiant energy and remains cool while any energy absorbing material, such as the susceptor and wafer in interior, will be heated. A front bottom panel 85 is disposed between front end 19 and an intermediate section 29. A vertical wall 87 depends downwardly from the end of the front bottom panel and terminates at an elongated, generally rectangular, substantially planar quartz rear bottom panel. A circular aperture 41 is formed in intermediate section 29 of the second bottom panel. A tube 91 depends vertically downward from the aperture. A shaft 49 depends downwardly through the tube for supporting pedestal 47, susceptor 43 and wafer 45. Purge gas is supplied to an inlet 95 defined by wall 99 of tube 91 and the purge gas is conveyed to interior 93 within the tube and then into interior 111 of reaction chamber 81. The purge gas flow is shown by arrows 97. Front end 19 of the reaction chamber includes flange 101 and a reactant gas injector port. Gate assembly 103 is mounted in abutting relationship to flange 101 for injecting reactant gases through inlet 21. Similarly, rear end 23 of the reaction chamber includes flange 105 and gate assembly 107 having a spent gas outlet 25. The upper end of vertical wall 87 at the junction with front bottom wall 85 is referred to as lip 109; the area between the lip and circumference 59 of susceptor 45 defines a gap 110 therebetween. The gap permits flow of gas from the interior of front end 19 to interior 111 beneath susceptor 43.

The vertical height between top panel 83 and rear bottom panel 89 is approximately equal to or slightly greater than twice the height of the front end measured as the perpendicular distance between inside surface 115 of top panel 83 and inside surface 117 of the front bottom panel 85 (see FIG. 3).

Front end 19 of reaction chamber 81 terminates in a flange 101 positioned in a cooperating relationship with gate assembly 103. Rear end 23 of the reaction chamber includes flange 105 surrounding gas outlet 25. The front bottom panel and front end 19 are terminated downstream by a curved vertical wall 35. The height of the rear part of the reaction chamber, as measured between inside surface 119 of the top panel and inside surface 120 of rear bottom panel 89 is equal to or slightly greater than twice the height of front end 19.

FIG. 5 illustrates yet another embodiment of the reaction chamber for improving the deposition process while eliminating or at least significantly reducing undesirable chemical deposits beneath susceptor 43. The horizontal area of well 33 is reduced by quartz plate 121 extending along the surface of bottom panel 15 from front end 19 toward susceptor 43. The quartz plate includes an extension 122 past lip 61 of the well to reduce gap 53 to a relatively narrower gap 125 between edge 127 and circumference 59 of the susceptor. Gap 125 restricts the ability of the reactant gas to pass through the gap and beneath the susceptor to form undesirable deposits thereon. FIG. 6 illustrates the reactant gas (arrow 27) passing over wafer 45 and arrow 28 illustrates a small portion of the reactant gas passing through gap 125 into cavity 36. The reactant gas (depicted by arrow 28) may result in undesirable deposits beneath the susceptor and on the support components which can result in contamination of wafer 45.

An alternate embodiment of the quartz plate is shown in FIG. 7. The individual quartz plate is replaced with an extension 129 of bottom panel 15 overhanging lip 61. The extension terminates at edge 131 of rear end 145 and has structure identified with that of edge 127 of quartz plate 121. The result achieved by the embodiment shown in FIG. 7 is substantially identical to that achieved with the embodiment shown in FIG. 6. Edge 131 is configured to define the narrowest gap with circumference 59 of susceptor 43 at center section 143. The gap between rear end 145 and circumference 59 of the susceptor 43 is nonlinear. Gap 145 is narrow and widens laterally outwardly from longitudinal axis 151 toward the reaction chamber sides to a maximum width designated by numeral 147.

Rear end 145 at least partially encircles a portion of circumference 59 of the susceptor and, in fact, encircles nearly 180° of the circumference. The gap continually widens as it extends laterally in each direction from center section 143. The narrowness of the gap at the center section reduces the chance of the reactant gas passing therethrough and forming undesirable deposits beneath susceptor 43. Furthermore, the reduced gap produces a positive effect on the reactant gas flow thereover and serves to partially reshape the velocity profile of the reactant gas passing thereover to ensure the production of a more uniform deposition on the surface of wafer 45.

Figure 9:
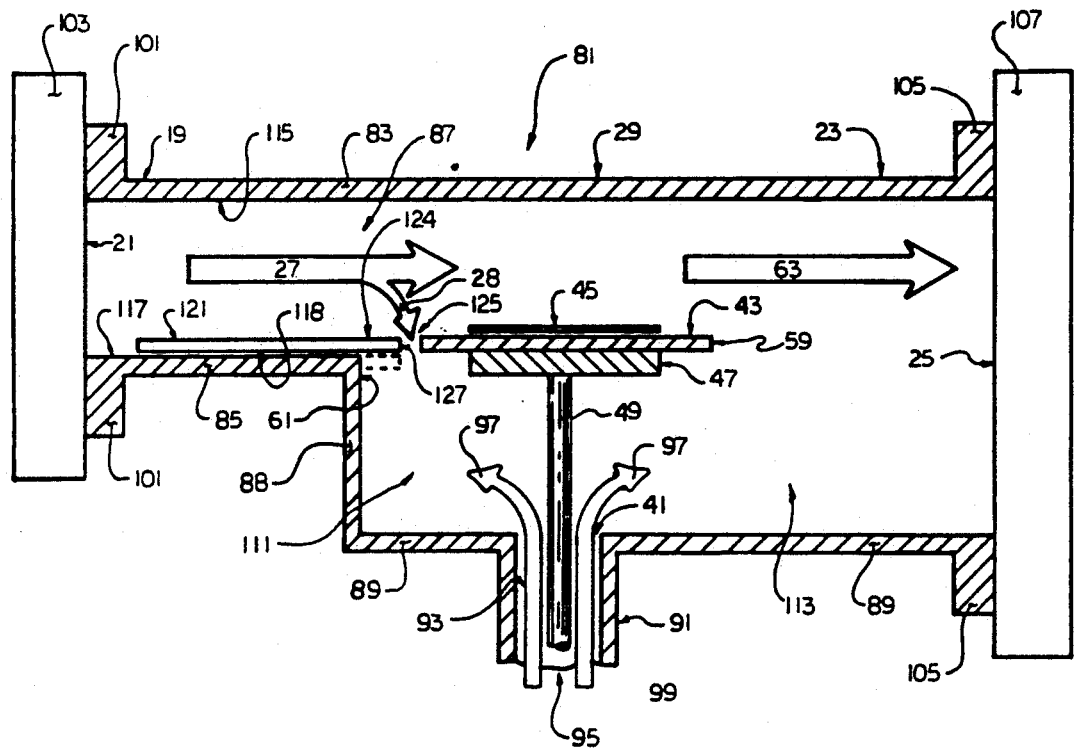
FIG. 9 is a cross sectional view showing a quartz plate disposed on the bottom plate of the reaction chamber shown in FIG. 3.

FIG. 9 illustrates a dual height reaction chamber 81 similar to that shown in FIG. 3. Quartz panel 121 is disposed with its lower surface 118 upon top surface 117 of front bottom panel 85 between front end 19 and susceptor 43. An extension of the quartz plate extends beyond the lip 61 to overhang near bottom panel 89 substantially parallel thereto and to reduce gap 125 between edge 127 of the quartz plate and the circumference of susceptor 43. The height of rear end 23 of the reaction chamber is substantially equal to twice the height of the front end of the reaction chamber. In addition to providing the necessary space for mounting the susceptor, the wafer, the pedestal and the shaft, the height of the reaction chamber at the rear end provides adequate access space for installing the susceptor assembly and quartz plate 121.

Figure 10:
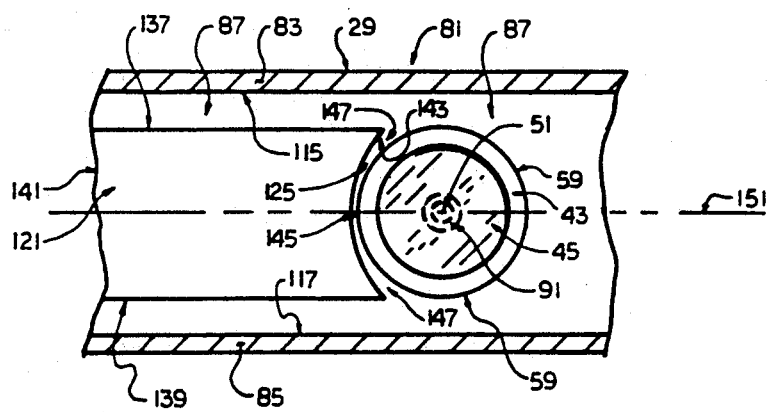
FIG. 10 is a partial top view of the quartz plate and the susceptor shown in FIG. 9.

FIG. 10 is a partial top view of a part of the reaction chamber shown in FIG. 9 and illustrates the gap between edge 127 of the extension and circumference 59 of susceptor 43. The quartz plate is shown as having a front end and a pair of parallel sides 137, 139 which are generally perpendicular to the front end 141 and generally adjacent to the sides of the reaction chamber. Rear end 145 defines a narrow gap 125 with circumference 59. The gap includes a center section 143 coincident with longitudinal axis 151 and the gap widens laterally from the center section to the widest gap at opposite ends 147 of the gap. Edge 127 is shaped to define the gap as nonlinear. An arc of less than 180° of the circumference of the susceptor is encircled by edge 127.

A variant of quartz plate 121 is shown in FIG. 9 and it is indicated by the dotted horizontal extension of front bottom panel 85 beyond lip 61 and into interior 111. This extension serves in the manner of quartz plate 121.

In the preferred embodiment, the top panel, the bottom panel and the sides of the reaction chamber are of quartz or other suitable material which is transparent to the type of radiation used to heat the interior of the reaction chamber, but typically the material is quartz. The material of the pedestal, the depending shaft, the tubular element and the quartz plate typically are also of fused quartz.

The susceptor typically includes a graphite (carbon) body having a thin coating of silicon carbide over the outer surface thereof. The graphite is susceptible to being heated. The reactant gases used in almost all epitaxial depositions of silicon are compounds containing one silicon atom and four other atoms that are either chlorine or hydrogen or a combination of the two. The four most commonly used sources of silicon include Silane (SiH$_4$), Dichlorosilane (SiH$_2$Cl$_2$), Trichlorosilane (SiHCl$_3$), and Silicon Tetrachloride (SiCl$_4$). Similarly, the gases most commonly used to control the type of conductivity and the resistivity of the epitaxial layer must be compatible with the gases already present in the reaction chamber. These are referred to as dopant gases and the most commonly used include Arsine (AsH$_3$), Phosphine (PH$_3$) and Diborane (B$_2$H$_6$)

To optimize the vertical spacing between the level of the susceptor and the level of the adjacent bottom plate, the shaft and pedestal supporting the susceptor can be raised or lowered for optimal performance of the system. Furthermore, the shaft can be rotated to rotate the susceptor and the wafer demountably mounted thereon in order t average out imperfections in the deposition process and provide a truly uniform deposition on the surface of the wafer. The importance of shaping the velocity profile of the incoming reactant gases is to produce either a linear thickness distribution upstream to downstream or a truly uniform coating on the surface of the wafer. If the wafer is rotated, the linear deposition will be averaged out and a truly uniform deposition will result. Various features such as the quartz plate and the narrowed gap tend to produce or shape the velocity profile to optimize the uniformity of the deposition.

The reduction, with respect to the prior art, of the cross sectional area of the reaction chamber upstream of the susceptor serves to greatly increase the velocity of the gas flow, reduce the processing time, reduce wasted gas and reduce the amount of gas required to perform the deposition process. Thus, the efficiency of the process, especially for processing a single wafer on a one at a time basis is enhanced.

We claim:

1. A method for processing a wafer within a reaction chamber, said method comprising in combination:
    a) receiving and exhausting a reactant gas through an inlet and an outlet, respectively, of the reaction chamber, which reaction chamber includes a bottom panel extending downstream of the inlet and terminating at a terminal edge;
    b) supporting the wafer upon a susceptor, which susceptor is downstream of the terminal edge of the bottom panel;
    c) locating the susceptor in a well disposed proximate the terminal edge of the bottom panel to prevent the susceptor from being in the mainstream of flow of reactant gas between the inlet and the outlet; and
    d) shaping the velocity profile of the flow of reactant gas flowing across the wafer to assist in carrying out the vapor deposition process more uniformly across the wafer, said step of shaping including the step of providing a varying flow rate of reactant gas through a gap, which gap is defined between the terminal edge and the circumference of susceptor, and into the well, the gap being of a predetermined width at a central segment of the gap adjacent the circumference of the susceptor upstream of the center of the susceptor and increasing in width in opposed directions along the terminal edge, the varying reactant gas flow rate across the wafer having a first value at the central segment of the gap and ranging along the gap in opposed directions to a second valve at the opposed extremities of the gap, whereby the velocity profile of the reactant gas flow laterally across the wafer is a function of and modified by the reactant gas flow through the varying width gap upstream of the wafer.

2. The method for processing a wafer within a reaction chamber as set forth in claim 1 including the step of reducing the flow rate of the reactant gas downstream of the susceptor by increasing the cross sectional area of the reaction chamber downstream of the susceptor.

3. A method for processing a wafer within a reaction chamber, said method comprising in combination:
    a) receiving and exhausting a reactant gas through an inlet and an outlet, respectively, of the reaction chamber, which reaction chamber includes a quartz plate extending downstream of the inlet and terminating at a terminal edge;
    b) supporting the wafer upon a susceptor having a circumference, which susceptor is downstream of the terminal edge of the quartz plate;
    c) locating the susceptor in a well disposed proximate the terminal edge of the quartz plate to prevent the susceptor from being in the mainstream of flow of reactant gas between the inlet and the outlet; and
    d) shaping the velocity profile of the flow of reactant gas flowing across the wafer to assist in carrying out the vapor deposition process more uniformly across the wafer, said step of shaping including the step of providing a varying flow rate of reactant gas through a gap, which gap is defined between the terminal edge and the circumference of susceptor, and into the well, the gap being of a predetermined width at a central segment of the gap adjacent the circumference of the susceptor upstream of the center of the susceptor and increasing in width in opposed directions along the terminal edge, the varying reactant gas flow rate across the wafer having a first value at the central segment of the gap and ranging along the gap in opposed directions to a second value at the opposed extremities of the gap, whereby the velocity profile of the reactant gas flow laterally across the wafer is a function of and modified by the reactant gas flow through the varying width gap upstream of the wafer.

4. The method for processing a wafer within a reaction chamber as set forth in claim 3 including the step of reducing the flow rate of the reactant gas downstream of the susceptor by increasing the cross sectional area of the reaction chamber downstream of the susceptor.

* * * * *